United States Patent [19]

Hiraoka

[11] 4,004,043
[45] Jan. 18, 1977

[54] NITRATED POLYMERS AS POSITIVE RESISTS

[75] Inventor: Hiroyuki Hiraoka, Los Gatos, Calif.

[73] Assignee: International Business Machines Corporation, Armonk, N.Y.

[22] Filed: Sept. 26, 1975

[21] Appl. No.: 616,980

[52] U.S. Cl. .................................. 427/43; 96/36.2; 96/115 R; 427/273
[51] Int. Cl.² .......................................... B05D 3/06
[58] Field of Search ..................... 427/43, 44, 273; 96/35.1, 36.2, 27 R, 115 R

[56] References Cited
UNITED STATES PATENTS

| | | | |
|---|---|---|---|
| 3,535,137 | 10/1970 | Haller et al. | 427/43 |
| 3,849,137 | 11/1974 | Barzynski et al. | 96/115 R |
| 3,885,964 | 5/1975 | Nacci | 96/115 R |

*Primary Examiner*—John H. Newsome
*Attorney, Agent, or Firm*—Joseph G. Walsh

[57] ABSTRACT

Positive resists are made using polymers and copolymers of methacrylic acid, methacrylic anhydride, methyl methacrylate, methacrylimide, and N-alkyl-methacrylimides which have been nitrated in up to about 10% of the monomer units on the methyl groups branching off the polymer chain. Inclusion of the nitro groups results in an increase of over an order of magnitude in the speed of development of images when the polymers are used as positive resists.

8 Claims, No Drawings

NITRATED POLYMERS AS POSITIVE RESISTS

FIELD OF THE INVENTION

The present invention is concerned with a process for forming an image by means of a positive resist exposed to radiation such as electron beam or ultra-violet light. In particular, it is concerned with resists which are nitrated polymers and copolymers of methacrylic acid, methacrylic anhydride, methyl methacrylate, methacrylimide, and N-alkyl-methacrylimides.

Prior Art

Positive acting polymeric electron beam resists are well known in the prior art. Such prior art is thoroughly discussed in, for example, U.S. Pat. No. 3,535,137 of Haller et al. That patent provides a very good discussion of typical methods for fabricating and using resist materials. As is explained in that patent, the process typically starts by dissolving a suitable polymer in a solvent. A thin polymer film is then formed on a substrate by a process such as, for example, spinning a drop of the dissolved polymer on the substrate surface and allowing it to dry. The polymer film may then be baked to improve the adhesion and handling characteristics of the film. The next step involved image-wise exposing of selected portions of the polymer film to electron beam radiation, in the range of 5 to 30 kilovolts, or to ultra-violet radiation. This radiation causes scission of the bonds of the polymer. As a result of such scissions, the portions of the polymer film which have been exposed to the radiation may be selectively removed by application of a developer solvent while leaving the unexposed portion of the film still adhered to the substrate. When it is so desired, the remaining polymer film may be baked to eliminate undercutting. Following this, in cases where it is so desired, the exposed underlying substrate may be etched with a suitable etchant.

There are relatively few materials which simultaneously possess all of the required properties to act as resists. It is necessary that the material be chemically resistant to etching solutions but still degrade under radiation. The material must be capable of adhering to the substrate as a film, and the film must resist cracking.

The use in positive acting electron beam resists of polymers and copolymers of methacrylic acid, methacrylic anhydride, methyl methacrylate, methacrylimide, and N-alkyl-methacrylimides is known. The present invention differs from the prior art in that these materials have been nitrated with up to about 10% of the monomer units containing a nitro group on the methyl group branching off the polymer chain.

SUMMARY OF THE INVENTION

According to the present invention, positive acting resists are made using nitrated polymers and copolymers. The polymers and copolymers are those of methacrylic acid, methacrylic anhydride, methyl methacrylate, methacrylimide, and N-alkyl-methacrylimides. According to the present invention, when such polymers and copolymers are nitrated with up to about 10% of the monomer units containing a nitro group, a very great increase in the development speed is obtained. This increase is more than an order of magnitude.

The speed of development increases with the amount of nitration. That is to say, the more nitrated the polymer or copolymer is, the greater the speed of development. Even small amounts of nitration are sufficient to increase the speed. It has, however, been found that in instances where more than about 10% of the monomer units are nitrated, the resulting polymers and copolymers tend to decompose and they do not have the chemical stability required for practical use as resists. Below about 10%, however, chemical stability is not unduly impaired. In general, from about 4% to about 7% nitration of the monomer units yields the optimum results.

It has been found that the major nitration occurs on the methyl groups branching off the main polymer chain. In the case of polymers and copolymers containing methyl methacrylate, a minor portion of the nitration does occur on the carbon atom of the methyl ester group, but the majority of the nitration is still on the methyl group branching off the main polymer chain.

In one preferred variation of the present invention, the polymer resist film is nitrated during the prebaking process. This is accomplished by carrying out the normal prebaking, but carrying it out in the presence of a nitrating agent. The preferred nitrating agents are $NO_2Cl$ and $NO_2$. The process is very conveniently carried out at a temperature range of 160° to 190° C.

The following examples are given solely for purposes of illustration and are not to be considered limitations on the invention, many variations of which are possible without departing from the spirit or scope thereof.

EXAMPLE I

Nitration of Poly(methylmethacrylate) (PMMA)

PMMA (1 g) was dissolved in chloroform (100 ml) in a Pyrex glass flask; then, $NO_2$ (6 liter at 24° C and 1 atm) was bubbled through the solution for several hours with an oxygen flow, while irradiated with a medium pressure mercury lamp. The nitrated product thus obtained has IR absorption at 1560 cm$^{-1}$ (-$NO_2$) and 1640 cm$^{-1}$ which indicates not only $NO_2$, but also an oxime group incorporated to a small degree.

The nitrated polymer can be spun coated on a substrate to form a film, and exposed to electron beam radiation of 23 KeV at $10^{-5}$ Coulomb/cm$^2$ dosage, all in the conventional way. Following exposure, the image can be developed with solvents, preferably either 2-heptanone or a 4 to 1 mixed solvent of ethoxyethyl acetate and ethanol.

EXAMPLE II

Nitration of Copolymers of Methylmethacrylate and methacrylic acid

Two methods were carried out; one is suspension nitration in chloroform with $NO_2$, while irradiated with light with $\lambda > 3000$ A, as in Example I. The other is thin film nitration with $NO_2Cl$, while irradiated with light with $\lambda > 3000$ A. The nitrated copolymer obtained by the first method, has a small amount of nitric acid ester group, as indicated by IR absorption at 1610 cm$^{-1}$. Moreover, common to solution reactions of polymers, partial degradation seems to take place, resulting in a poor quality film, in some degree. The second method of thin film nitration yielded new IR absorption ascribed exclusively to C-$NO_2$ group ($\gamma_{asym}$ 1,565 cm$^{-1}$, $\gamma_{sym}$ 1,375 cm$^{-1}$), and its partial degradation due to nitration seems minimal in comparison with the one obtained in the solution nitration. The technique employed was the following: An ethanol-acetone solution of the copolymer was placed in a round Pyrex flask, and the solvent was evaporated, leaving a uniform film covering the entire surface of the inner wall of the flask wall. The solvent vapor was completely removed in high vacuum, and then nitryl chloride ($NO_2Cl$) prepared from fuming nitric acid and chlorosulfuric acid was introduced up to near atmospheric pressure. Irradiation from outside the flask was carried out for several hours with mercury lamps. Because Pyrex glass only transmits light with wave length longer than 3000 A, and in this region the copolymer does not have any absorption, only nitryl chloride photodecomposes to $NO_2$ + Cl; chlorine atoms abstract hydrogens, while $NO_2$ adds to the radicals formed by removal of hydrogen. One such operation yielded an apparent concentration ratio of nitro group to carbonyl group of 0.09, based on the same absorption coefficient. The nitrated polymer formed by this process gave excellent results as a positive electron beam resist.

EXAMPLES III, IV AND V

Nitrations of Poly (methacrylic anhydride), poly (dimethacrylimide), and poly (N-methyl dimethacrylimide)

Thin films (a few micron thick) of poly (methacrylic anhydride), poly (dimethacrylimide) and poly (N-methyl dimethacrylimide) were prepared on silicone wafers and on sodium chloride plates. They were placed in a vessel which was pumped down to $10^{-3}$ torr to remove the air. After introducing nitrogen dioxide to about 40 cmHg, the entire vessel was placed in an oil bath held at 190° C for 45 min, and then pumped down to $10^{-3}$ torr at room temperature. The polymer films thus treated on silicone wafers were used for the electron beam exposure at 23 KeV at a dosage of $10^{-5}$ Coulomb/cm$^2$, which yielded excellent results after development in 2-methoxy ethanol. The polymer films on sodium chloride plates were used for IR absorption spectrometry. The poly (methacrylic anhydride) film, after the nitrogen dioxide treatment, has the nitro-group absorption at 1,547 cm$^{-1}$ with a relative absorption intensity, 5% to the carbonyl groups. The nitro groups of both poly (dimethacrylimide) and poly (N-methyl dimethacrylimide) appeared at 1,548 cm$^{-1}$ with the similar relative intensity, ca. 5% to the carbonyl groups. In the latter polyimide cases, a small degree of the reverse reaction to the poly-anhydride took place. This can be avoided by the nitration of the poly-anhydride, followed by the ammonia treatment.

What is claimed is:
1. A process for forming an image with a positive resist, said process comprising the steps of:
   1. forming on a substrate a film comprising a polymer or copolymer of methacrylic acid, methacrylic anhydride, methyl methacrylate, methacrylimide, and N-alkyl-methacrylimides, said polymer or copolymer having been nitrated in up to about 10% of the monomer units on the methyl group branching off the polymer chain,
   2. exposing said film in a predetermined pattern to radiation, and
   3. removing the radiation exposed portion of said film with a solvent.
2. A process as claimed in claim 1 wherein the radiation is electron beam.
3. A process as claimed in claim 1 wherein the radiation is ultra-violet light.
4. A process as claimed in claim 1 wherein from about 4% to about 7% of the monomer units have been nitrated on the methyl group branching off the polymer chain.
5. A process as claimed in claim 1 wherein the nitration is carried out in situ by contacting a polymer film with $NO_2$ or $NO_2Cl$.
6. A process as claimed in claim 1 wherein the polymer film is methyl methacrylate nitrated in from about 4 to about 7% of the monomer units on the methyl group branching off the polymer chain.
7. A process as claimed in claim 1 wherein the polymer film is a copolymer of methyl methacrylate and methacrylic acid nitrated in from about 4 to about 7% of the monomer units on the methyl group branching off the polymer chain.
8. A process as claimed in claim 1 wherein the polymer film is methacrylimide nitrated in from about 4 to about 7% of the monomer units on the methyl group branching off the polymer chain.

* * * * *